United States Patent
Zang et al.

(10) Patent No.: US 10,872,979 B2
(45) Date of Patent: Dec. 22, 2020

(54) SPACER STRUCTURES FOR A TRANSISTOR DEVICE

(71) Applicant: GLOBALFOUNDRIES Inc., Grand Cayman (KY)

(72) Inventors: Hui Zang, Guilderland, NY (US); Chung Foong Tan, Ballston Spa, NY (US); Guowei Xu, Ballston Lake, NY (US); Haiting Wang, Clifton Park, NY (US); Yue Zhong, Ballston Lake, NY (US); Ruilong Xie, Niskayuna, NY (US); Tek Po Rinus Lee, Ballston Spa, NY (US); Scott Beasor, Greenwich, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 16/776,807

(22) Filed: Jan. 30, 2020

(65) Prior Publication Data

US 2020/0168731 A1    May 28, 2020

Related U.S. Application Data

(62) Division of application No. 16/038,384, filed on Jul. 18, 2018, now Pat. No. 10,629,739.

(51) Int. Cl.
*H01L 29/78* (2006.01)
*H01L 21/8234* (2006.01)
(Continued)

(52) U.S. Cl.
CPC ...... *H01L 29/785* (2013.01); *H01L 21/30608* (2013.01); *H01L 21/76829* (2013.01);
(Continued)

(58) Field of Classification Search
CPC .................. H01L 29/66545; H01L 27/0886
See application file for complete search history.

(56) References Cited

U.S. PATENT DOCUMENTS

| 9,437,503 | B1 | 9/2016 | Mallela et al. |
| 9,515,156 | B2 | 12/2016 | Besser et al. |
| (Continued) | | | |

FOREIGN PATENT DOCUMENTS

| TW | 201344800 A | 11/2013 |
| TW | 201712866 A | 4/2017 |

OTHER PUBLICATIONS

Office Action from corresponding Taiwanese patent application No. 108121080 dated Apr. 15, 2020.

*Primary Examiner* — Jay C Chang
*Assistant Examiner* — Mikka Liu
(74) *Attorney, Agent, or Firm* — Francois Pagette; Hoffman Warnick LLC

(57) ABSTRACT

An integrated circuit product is disclosed that includes a transistor device that includes a final gate structure, a gate cap, a low-k sidewall spacer positioned on and in contact with opposing sidewalls of the final gate structure, first and second contact etch stop layers (CESLs) located on opposite sides of the final gate structure, whereby the CESLs are positioned on and in contact with the low-k sidewall spacer, and a high-k spacer located on opposite sides of the final gate structure, wherein the high-k spacer is positioned in recesses formed in an upper portion of the CESLs.

17 Claims, 9 Drawing Sheets

(51) Int. Cl.
*H01L 29/08* (2006.01)
*H01L 21/768* (2006.01)
*H01L 21/306* (2006.01)
*H01L 29/66* (2006.01)

(52) U.S. Cl.
CPC ........ *H01L 21/823418* (2013.01); *H01L 21/823431* (2013.01); *H01L 21/823468* (2013.01); *H01L 29/0847* (2013.01); *H01L 29/66545* (2013.01)

(56) References Cited

U.S. PATENT DOCUMENTS

| | | |
|---|---|---|
| 9,536,793 B1 | 1/2017 | Zhang et al. |
| 2007/0243671 A1 | 10/2007 | Liaw |
| 2010/0207193 A1* | 8/2010 | Tanaka ............. H01L 27/11582 257/324 |
| 2014/0291737 A1 | 10/2014 | Hafez et al. |
| 2017/0084714 A1* | 3/2017 | Ching .................. H01L 29/785 |
| 2018/0138280 A1 | 5/2018 | Li et al. |
| 2018/0166532 A1 | 6/2018 | Hsu et al. |
| 2019/0058050 A1 | 2/2019 | Hsu et al. |

* cited by examiner

SPACER STRUCTURES FOR A TRANSISTOR DEVICE

BACKGROUND

Field of the Disclosure

The present disclosure generally relates to the fabrication of integrated circuits, and, more particularly, to various embodiments of novel spacer structures for a transistor device.

Description of the Related Art

In modern integrated circuits, such as microprocessors, storage devices and the like, a very large number of circuit elements, especially field effect transistors (FETs), are formed and operated on a restricted chip area. FETs come in a variety of different configurations, e.g., planar devices, FinFET devices, nanowire devices, etc. These transistors may have different channel lengths, i.e., short channel devices and long channel devices (e.g., devices with a gate length of 20 nm or more).

Many advanced transistors are fabricated using known replacement gate manufacturing (RMG) techniques. Manufacturing a device while using an RMG process involves, among other things, forming a sacrificial gate structure, performing various process operations with the sacrificial gate structure in position, removing the sacrificial gate structure and replacing it with a final gate structure. Typically, due to performing several process operations, there may be a significant difference in the height of the sacrificial gate structure (including the gate cap) and the height of the final gate structure (including the gate cap), with the final gate structure being shorter.

Additionally, in modern integrated circuit products, the gate structures of transistor devices are fabricated side by side such that there is a shared source/drain region located in the lateral space between the gate structures. The gate structures also typically have one or more sidewall spacers (e.g., a low-k spacer, a contact etch stop layer) positioned on the sidewalls of the gate structures, which further reduces the space between the gate structures. As a result, the aspect ratio of the space between the gate structures has significantly increased as advanced device technologies have been developed and brought to market. Ultimately, the spaces between the gate structures will be filled with an insulating material. However, due to the higher aspect ratios, reliably filling such spaces with insulating material without forming an unacceptable amount of voids can be very difficult.

Accordingly, material manufacturers have developed so-called "flowable" insulating materials that can more readily fill such high aspect ratio spaces. Some of these flowable materials may be applied by spin-coating techniques. Unfortunately, while these flowable insulating materials can more reliably fill such spaces, they are of lesser quality than other insulating materials such as HDP oxides. That is, the flowable materials have a lesser mechanical strength than that of such higher quality insulating materials. Thus, process flows have been developed wherein, after the space between the gate structures has been filled with such a flowable material, a recess etching process is performed to remove some of the flowable material within the space. At that point, a cap of higher quality insulating material is formed above the recessed flowable material.

One problem encountered when recessing the flowable insulating material is that a portion of the vertical height of the spacers positioned adjacent the gate structures is also removed. This may be referred to as "spacer pull-down." In some situations, the spacer pull-down may result in the exposure of a portion of the sidewalls of the sacrificial gate structure. Another problem that exists relates to the thickness of the protective cap layer of the higher quality insulating material. Ultimately, a process will be performed to "cut" the sacrificial gate structures into separate desirable lengths. As part of the gate-cut process operation, the protective cap layer of higher quality insulating material is subjected to attack. If the protective cap layer of higher quality insulating material is too thin, it will be removed and the underlying flowable insulating material will be subjected to the gate-cut etching process, thereby resulting in rapid removal of the lower quality flowable insulating material. As a result, conductive material may ultimately be formed in the area where the protective cap layer of higher quality insulating material has been unintentionally removed, thereby resulting in a potential path for a short circuit between the final gate structures and other conductive structures formed on the IC product.

The present disclosure is directed to various embodiments of novel spacer structures for a transistor device that may solve or at least reduce one or more of the problems identified above.

SUMMARY

The following presents a simplified summary of illustrative embodiments of the invention in order to provide a basic understanding of some aspects of the illustrative embodiments of the invention specifically disclosed herein. This summary is not an exhaustive overview of the various illustrative embodiments of the inventions disclosed herein. It is not intended to identify key or critical elements of the illustrative embodiments of inventions disclosed herein or to delineate the scope of the invention. Its sole purpose is to present some concepts in a simplified form as a prelude to the more detailed description that is discussed later.

Generally, the present disclosure is directed to various methods of forming spacers adjacent gate structures of a transistor device and various integrated circuit products that include transistor device structures. One illustrative integrated circuit product disclosed herein includes a transistor device that includes a final gate structure, a gate cap, a low-k sidewall spacer positioned on and in contact with opposing sidewalls of the final gate structure, first and second contact etch stop layers (CESLs) located on opposite sides of the final gate structure, whereby the CESLs are positioned on and in contact with the low-k sidewall spacer, and a high-k spacer located on opposite sides of the final gate structure, wherein the high-k spacer is positioned in recesses formed in an upper portion of the CESLs.

One illustrative device disclosed herein includes a final gate structure for a transistor device, a gate cap positioned above the final gate structure and first and second source/drain regions formed in a semiconductor substrate on opposite sides of the final gate structure. In this example, the device also includes a low-k sidewall spacer positioned on and in contact with opposing sidewalls of the final gate structure, first and second contact etch stop layers (CESL) located on opposite sides of the final gate structure, wherein the first and second CESLs are positioned on and in contact with the low-k sidewall spacer. In this example, each of the first and second CESLs have a recess formed in an upper portion thereof and the device further includes a high-k spacer located on opposite sides of the final gate structure, wherein the high-k spacer is positioned in the recesses formed in the first and second CESLs.

BRIEF DESCRIPTION OF THE DRAWINGS

The disclosure may be understood by reference to the following description taken in conjunction with the accompanying drawings, in which like reference numerals identify like elements, and in which.

Figure 1:
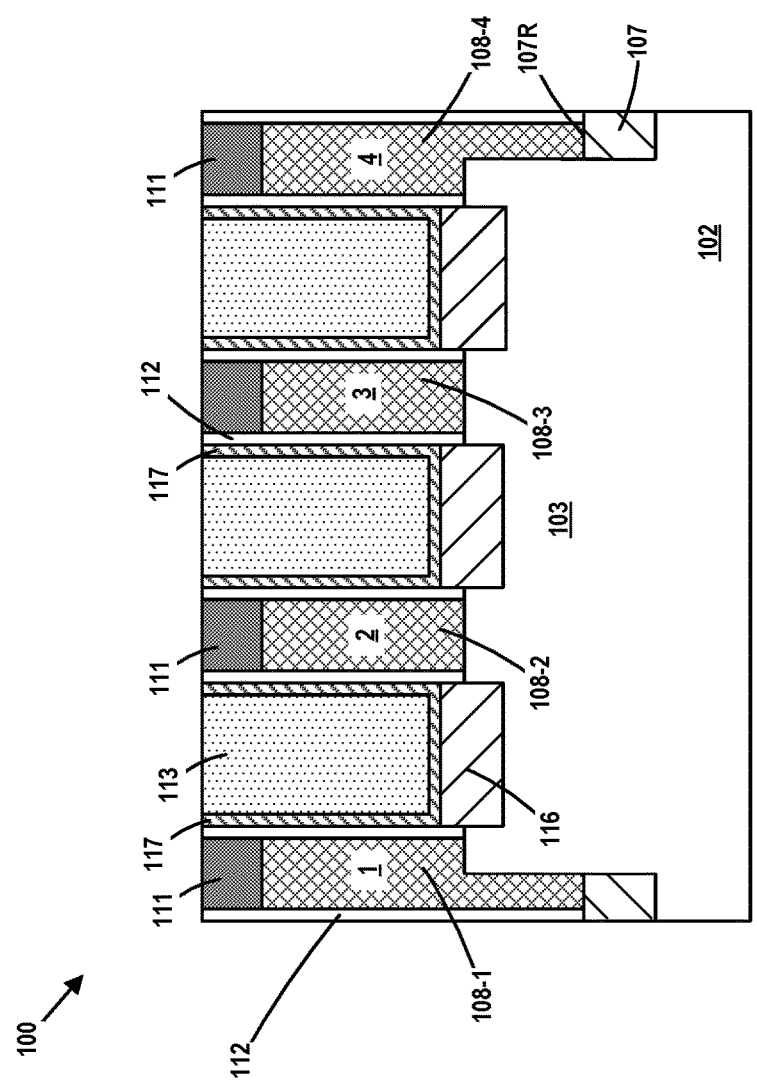
FIGS. 1-9 depict various methods disclosed herein for forming spacers adjacent gate structures of a transistor device and various transistor device structures.

While the subject matter disclosed herein is susceptible to various modifications and alternative forms, specific embodiments thereof have been shown by way of example in the drawings and are herein described in detail. It should be understood, however, that the description herein of specific and illustrative embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the under-standing of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming spacers adjacent gate structures of a transistor device and various transistor device structures. The methods and devices disclosed herein may be employed in manufacturing products using a variety of technologies, e.g., NMOS, PMOS, CMOS, etc., and they may be employed in manufacturing a variety of different devices, e.g., memory products, logic products, ASICs, etc. As will be appreciated by those skilled in the art after a complete reading of the present application, the inventions disclosed herein may be employed in forming integrated circuit products using transistor devices in a variety of different configurations, e.g., planar devices, FinFET devices, nanowire devices, etc. In the illustrative examples depicted herein, the transistor devices will be FinFET devices. The gate structures for the transistor devices may be formed using either "gate first" or "replacement gate" manufacturing techniques. Thus, the presently disclosed inventions should not be considered to be limited to any particular form of transistors or the manner in which the gate structures of the transistor devices are formed. Of course, the illustrative embodiments of the inventions disclosed herein should not be considered to be limited to the illustrative examples depicted and described herein. With reference to the attached figures, various illustrative embodiments of the methods and devices disclosed herein will now be described in more detail. The various layers of material described below may be formed by any of a variety of different known techniques, e.g., a chemical vapor deposition (CVD) process, an atomic layer deposition (ALD) process, a thermal growth process, spin-coating techniques, etc. Moreover, as used herein and in the attached claims, the word "adjacent" is to be given a broad interpretation and should be interpreted to cover situations where one feature actually contacts another feature or is in close proximity to that other feature.

FIGS. 1-9 depict various methods of forming novel spacer structures adjacent gate structures of a transistor device and various transistor device structures for an IC product 100 that is formed in and above a semiconductor substrate 102. The substrate 102 may have a variety of configurations, such as the depicted bulk silicon configuration. The substrate 102 may also have a semiconductor-on-insulator (SOI) configuration that includes a bulk semiconductor layer, a buried insulation layer and an active semiconductor layer positioned on the buried insulation layer, wherein semiconductor devices are formed in and above the active layer. The substrate 102 may be made of silicon or it may be made of materials other than silicon. Thus, the terms "substrate" or "semiconductor substrate" should be understood to cover all semiconducting materials and all forms of such materials. Additionally, various doped regions, e.g., halo implant regions, well regions and the like, are not depicted in the attached drawings.

With reference to FIG. 1, the product 100 generally comprises a plurality of sacrificial gate structures 108 (numbered 1-4 for ease of reference) for various transistor devices that are formed in and above a semiconductor substrate 102. In the illustrative example depicted herein, the transistor devices are FinFET devices, but the inventions disclosed herein should not be considered to be limited to IC products that include FinFET transistor devices, as the methods disclosed herein may be used to form a variety of different types of transistor devices. At the point of processing shown in FIG. 1, a fin 103 has been formed in the substrate 102 using traditional manufacturing techniques. The drawings herein depict cross-sectional views that are taken in the gate length (i.e., current transport) direction of the illustrative FinFET transistor devices, i.e., in a direction that corresponds to the long axis of the fin 103.

FIG. 1 depicts the IC product 100 after several process operations were performed. First, as noted above, the fins 103 were formed by performing one or more etching processes, e.g., anisotropic etching processes, through a patterned fin-formation etch mask (not shown) to form a plurality of fin-formation trenches in the substrate 102 and thereby define a plurality of fins 103 in the substrate (only one fin 103 is depicted so as facilitate disclosure of the subject matter herein). The width and height of the fins 103 may vary depending upon the particular application. Additionally, the overall size, shape and configuration of the fin-formation trenches and fins 103 may vary depending on the particular application. Next, a recessed layer of insulating material 107 (e.g., silicon dioxide) with a recessed upper surface 107R was formed between the fins 103 by performing traditional manufacturing techniques.

In the illustrative example depicted herein, the final gate structures for the transistor devices will be formed using replacement gate manufacturing techniques, although the inventions disclosed herein should not be considered to be limited to such replacement gate manufacturing techniques. Accordingly, still with reference to FIG. 1, after the layer of insulating material 107 was recessed, the sacrificial gate structures 108 were formed above the fin 103. Each of the sacrificial gate structures 108 includes a sacrificial gate insulation layer (not separately shown) such as a layer of silicon dioxide and a sacrificial gate electrode structure (not separately shown). The sacrificial gate electrode structures may be comprised of a material such as polysilicon or amorphous silicon. Also depicted in FIG. 1 are illustrative gate caps 111 positioned above each of the sacrificial gate structures 108. A typical method of forming these structures involves thermally growing or depositing a layer of sacrificial insulating material (not separately shown) on the exposed portions of the fin 103 above the recessed layer of insulating material. Thereafter, a layer of material for the sacrificial gate electrode structures 108 is blanket-deposited across the substrate 102 on the layer of sacrificial gate insulation material across the entire substrate. Next, a layer of material for the gate caps 111 is blanket-deposited across the entire substrate 102 above the layer of material for the sacrificial gate structures 108. Then, a patterned etch mask (not shown), e.g., a patterned OPL layer, was formed on the product 100. At that point, one or more etching processes were performed to remove the exposed portions of the layer of gate cap material and the layer of material for the sacrificial gate structures. Typically, the sacrificial gate insulation layer (not shown) remains in position around the entire fin 103 at the conclusion of these process operations.

With continued reference to FIG. 1, the next process operation involves the formation of an illustrative and simplistically depicted low-k sidewall spacer 112 adjacent the opposing lateral sidewalls of the sacrificial gate structures 108 and the gate caps 111. As used herein and in the appended claims, the term "low-k" sidewall spacer shall mean a sidewall spacer made from a material having a dielectric constant of 5.2 or less. In one illustrative example, the low-k spacer 112 may be comprised of a material such as SiCoNi, SiCo, SiOCN, SiOC, SiBCN, etc. The low-k spacer 112 may be formed by performing a conformal deposition process, e.g., a conformal ALD process, to deposit a conformal layer of low-k spacer material on the product and thereafter performing an anisotropic etching process to remove horizontally positioned portions of the layer of low-k spacer material. The conformal layer of low-k spacer material may be formed to any desired thickness, e.g., 6-8 nm. The low-k spacer 112 may have any desired thickness (as measured at the base of the low-k spacer 112). In some embodiments, the low-k spacer 112 may be formed on and in contact with the sidewalls of the sacrificial gate structures 108. In other embodiments, one or more additional materials may be positioned between the sacrificial gate structures 108 and the low-k spacer 112. Thus, when it is stated that the low-k spacer 112 is formed adjacent the gate structure, it should be understood to cover both of the above-described situations.

Next, the sacrificial gate insulation layer (not shown) located on the fin 103 between the low-k spacers 112 was removed by performing a brief oxide process so as to expose portions of the fin 103 in the source/drain regions on opposite sides of the gate structure 108. Then, regions of epi semiconductor material 116 were formed on the exposed portions of the fin 103, i.e., in the source/drain regions of the devices, by performing an epitaxial growth process. The epi material 116 may be formed to any desired thickness. However, it should be understood that the epi material 116 need not be formed in all applications.

The next process operation involves the formation of a contact etch stop layer (CESL) 117 on the product 100 in each of the source/drain regions. In the depicted example, the CESLs 117 are formed on and in contact with the low-k spacers 112. The CESLs 117 may be formed by performing a conformal deposition process, e.g., a conformal ALD process, to deposit a conformal layer of etch-stop material on the product 100. The conformal layer of etch-stop material may be formed to any desired thickness, e.g., 3-6 nm. The CESLs 117 may be comprised of any of a variety of different materials. In one illustrative example, the CESLs 117 may be comprised of a material such as silicon nitride, etc. At this particular point in the process flow, portions of the conformal layer of etch-stop material (not shown) are positioned above the upper surface of the gate caps 111.

Next a first layer of insulating material (ILD) 113 is blanket-deposited on the product 100 such that it over-fills the spaces between the sacrificial gate structures 108 and above the CESLs 117 and the regions of epi semiconductor material 116 in the source/drain regions of the device. At that point, one or more chemical mechanical polishing processes were performed using the gate caps 111 as a polish-stop. The first layer of insulating material 113 may be a material that has relatively good fill capability so as to insure that the space between the sacrificial gate structures 108, i.e., the spaces above the source/drain regions, is substantially completely filled with insulating material 113. As aspect ratios of such spaces continue to increase, such reliable fill capability is highly desirable. In one illustrative embodiment, the first layer of insulating material 113 may be a material such as a flowable oxide material (available from Dow Corning and other manufacturers) or a silicon dioxide material that is commonly referred to as TSOZ. In some embodiments, the first layer of insulating material 113 may be initially formed on the product 100 by performing a spin-coating process.

Figure 2:
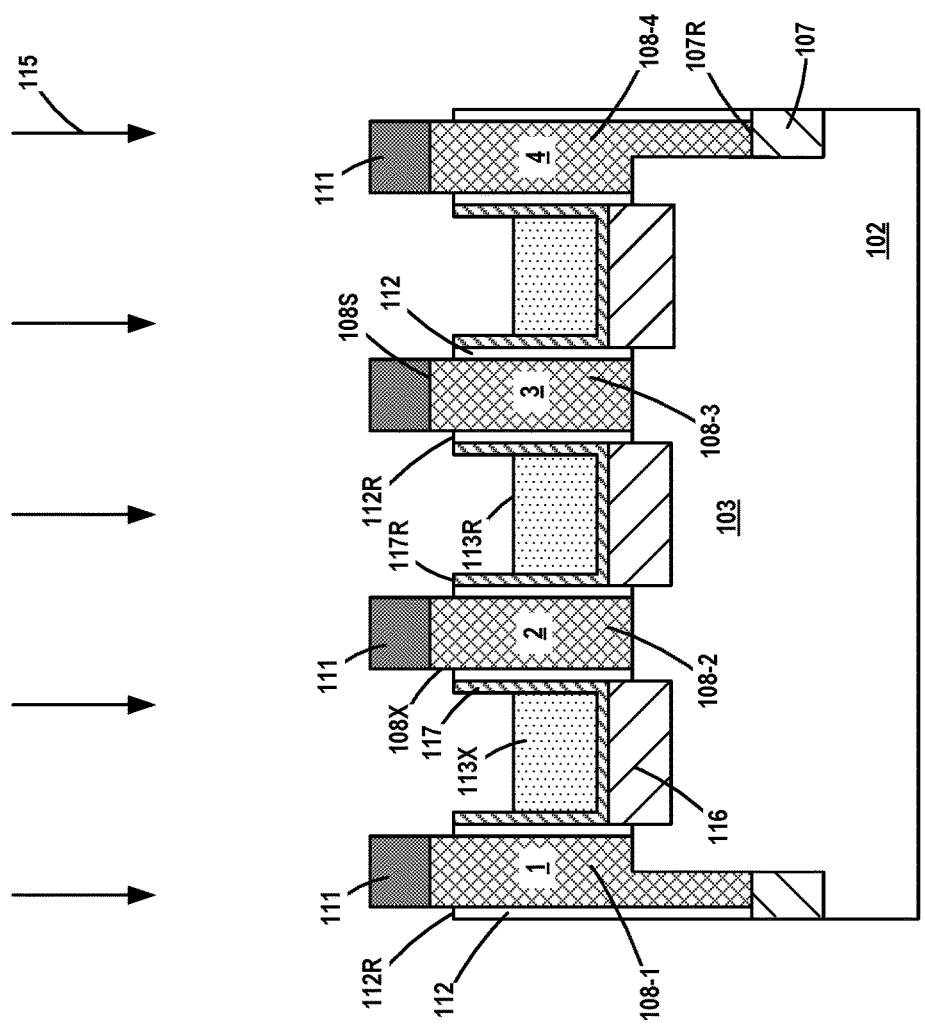

FIG. 2 depicts the product 100 after a recess etching process 115 was performed so as to remove portions of the first layer of insulating material (ILD) 113 so as to form a recessed layer of first insulating material 113X. At the conclusion of this process operation, the recessed first layer of insulating material 113X has a recessed upper surface 113R. The amount of recessing of the first layer of insulating material 113 may vary depending upon the particular application. Typically, the recessed upper surface 113R will be positioned at a level that is below a level of the upper surface 108S of the sacrificial gate structures 108. In one particular example, the recessed upper surface 113R may be positioned at a level that is about 20-30 nm below the level of the upper surface 108S of the sacrificial gate structures 108. In one illustrative example, 50-60 nm of the overall vertical height of the first layer of insulating material 113 may be removed during this recess etching process 115. It should also be noted that, as depicted, during the recess etching process 115, some of the initial vertical height of the low-k spacer 112 and some of the initial vertical height of the CESLs 117 may be removed as well, although not to the same extent as that of the first layer of insulating material 113. That is, at the conclusion of this recess etching process 115, the CESLs 117 may have a recessed upper surface 117R while the low-k spacer 112 may have a recessed upper surface 112R. In the depicted example, substantially equal amounts of the vertical portions of the low-k spacer 112 and the CESLs 117 are removed, but relatively different removal rates for the low-k spacer 112 and CESLs 117 are also possible depending upon the particular application. Also note that, depending upon the amount of recessing of the low-k spacer 112 and the CESLs 117, a portion of the sidewalls 108X of the sacrificial gate structures 108 may be exposed after the recess etching process 115 is competed.

Figure 3:
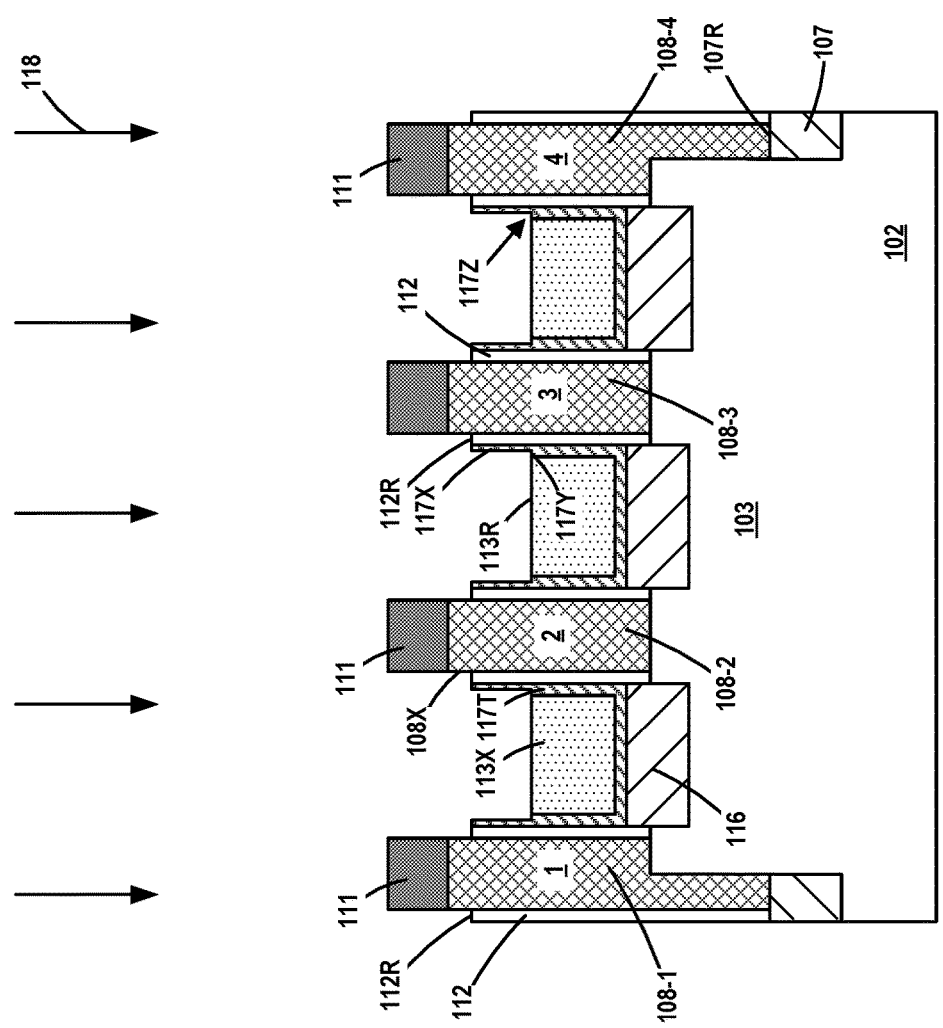

FIG. 3 depicts the product 100 after an etching process 118, i.e., a CESL trim process 118, was performed on the CESLs 117 to remove some of the lateral thickness of the exposed upper vertical portions 117X of the CESLs 117 relative to the surrounding materials and thereby form trimmed CESLs 117T with trimmed substantially vertically oriented portions with a reduced thickness as compared to the lower portions of the trimmed CESLs 117. The trimmed CESLs 117T have recesses 117Z that are defined by the substantially vertically oriented sidewalls of the upper vertical portions 117X and the substantially horizontally oriented recessed surface 117Y of the trimmed CESLs 117. The amount of recessing of the trimmed CESLs 117T and the size of the recesses 117Z may vary depending upon the particular application. In one illustrative embodiment, the CESL trimming process 118 may remove about 3-4 nm of the lateral width of the exposed vertical portions 117X of the CESLs 117. In one particular example, the etching process may be an isotropic etching process. In some embodiments, performing the CESL trim process 118 may result in very little recessing of the overall vertical height of the trimmed CESLs 117T.

Figure 4:
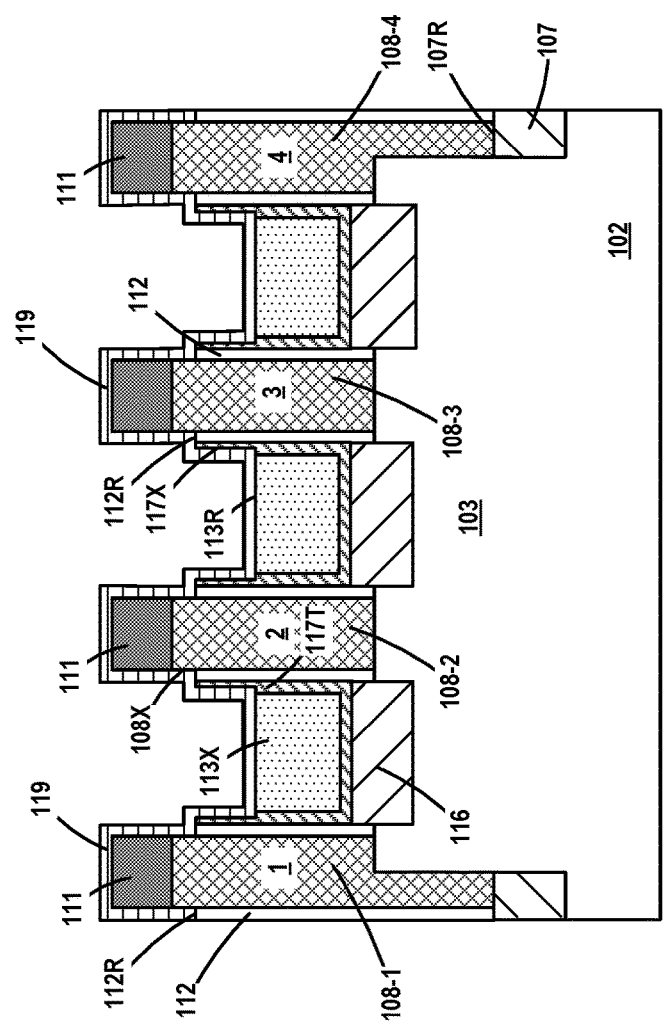
Figure 5:
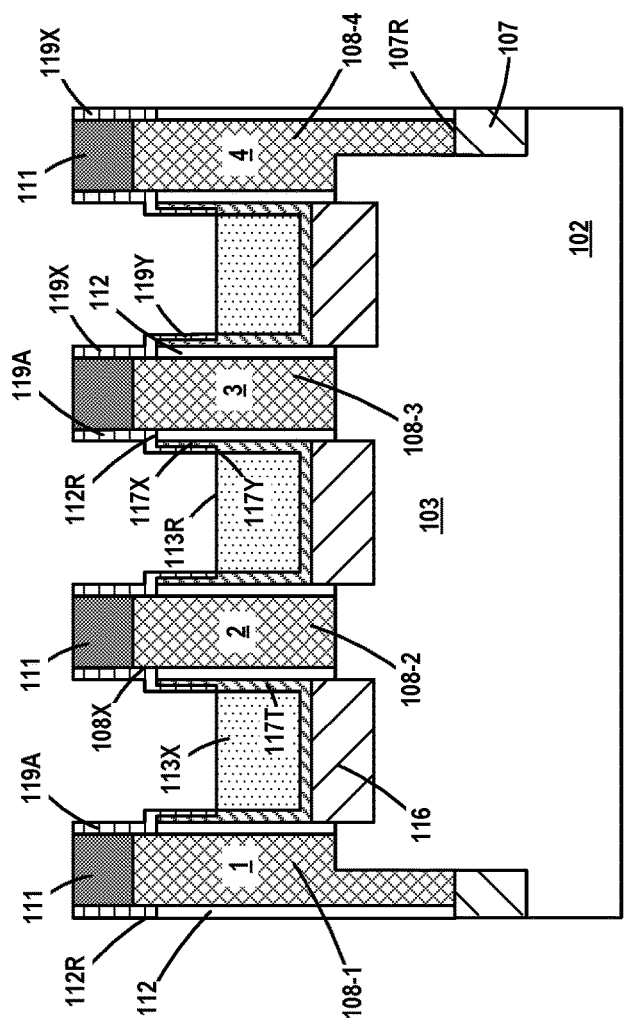

FIGS. 4 and 5 depict the formation of an illustrative and simplistically depicted high-k sidewall spacer 119A (see FIG. 5) adjacent the sacrificial gate structures 108 and the gate caps 111. As used herein and in the appended claims, the term "high-k" sidewall spacer shall mean a sidewall spacer made from a material having a dielectric constant of 10 or greater. In one illustrative example, the high-k spacer 119A may be comprised of a material such as hafnium oxide, AlN, Al$_2$O$_3$, etc. With reference to FIG. 4, the high-k spacer 119A may be formed by performing a conformal deposition process, e.g., a conformal ALD process, to initially deposit a conformal layer of high-k spacer material 119. Then, as shown in FIG. 5, an anisotropic etching process was performed to remove the horizontally positioned portions of the layer of high-k spacer material 119. The conformal layer of high-k spacer material 119 may be formed to any desired thickness, e.g., 3-4 nm.

With reference to FIG. 5, the high-k spacer 119A may have somewhat of a "stepped" profile with an upper portion 119X and a lower portion 119Y. In some embodiments, the upper portion 119X of the high-k spacer 119A may be formed on and in contact with the exposed sidewalls 108X of the sacrificial gate structures 108 and/or the gate caps 111. In other embodiments, one or more additional materials may be positioned between the upper portion 119X of the high-k spacer 119A and the sacrificial gate structures 108 and/or the gate caps 111. Note that, at this point in the process flow, the upper portion 119X of the high-k spacer 119A is at least partially positioned above, and formed on and in contact with, the recessed upper surface 112R of the low-k spacer 112. In some embodiments, the lower portion 119Y of the high-k spacer 119A may be formed laterally adjacent on or and in contact with the exposed and trimmed vertical portions 117X of the CESLs 117. In other embodiments, one or more additional materials may be positioned between the lower portion 119Y of the high-k spacer 119A and the exposed and trimmed vertical portions 117X of the CESLs 117. If the CESL trim etch process does result in some vertical pull-down of the exposed vertical portions 117X of the CESLs 117 (a situation not shown in the drawings), then a part of the lower portion 119Y of the high-k spacer 119A may be formed on and in contact with the low-k spacer 112. Note that, in one embodiment, at least a portion of the lateral width of the lower portion 119Y of the high-k spacer 119A is positioned above, and formed on and in contact with, the recessed upper surface 117Y of the trimmed CESLs 117T. Also note that, in some embodiments, at least the lower portion 119Y of the high-k spacer 119A may be positioned in the recesses 117Z in the trimmed CESLs 117.

Figure 6:
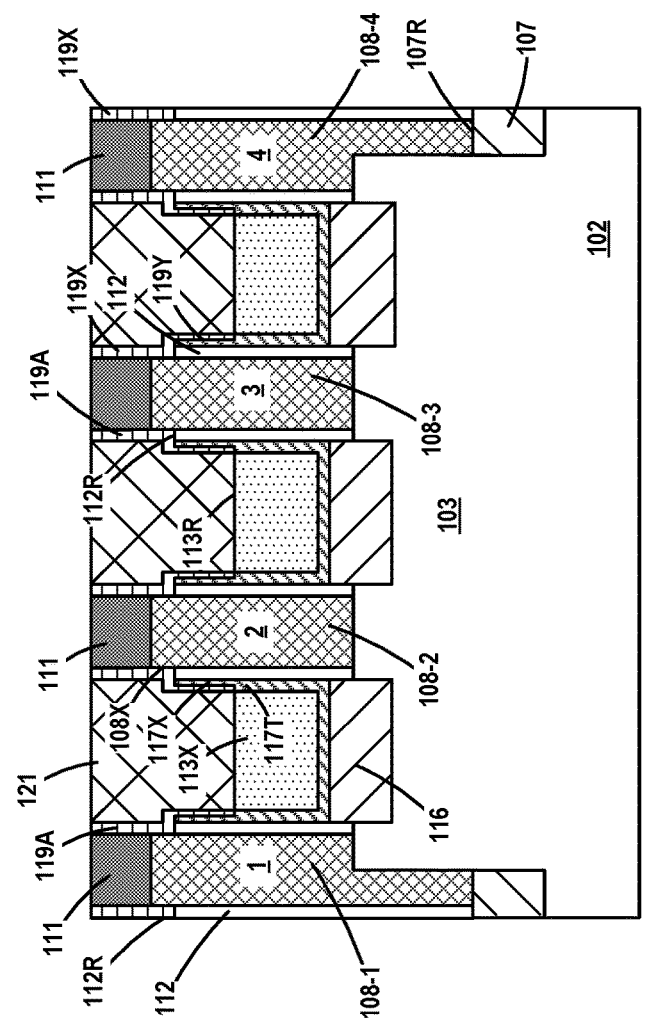

FIG. 6 depicts the product 100 after a layer of insulating material 121 was blanket-deposited on the product 100 such that it over-fills the spaces between the sacrificial gate structures 108 and above the recessed first layer of insulating material 113X. Thereafter, a CMP process was performed to planarize the layer of insulating material 121 using the gate caps 111 as a polish-stop. In general, as compared to the first layer of insulating material 113, the layer of insulating material 121 may be a higher quality material, i.e., a higher quality oxide that exhibits greater etch resistance than that of the first layer of insulating material 113. Typically, the layer of insulating material 121 may have a higher density. The insulating material 121 may be comprised of a variety of different materials that may be manufactured using a variety of different techniques. In one illustrative embodiment, the layer of insulating material 121 may be an HDP oxide, etc.

Figure 7:
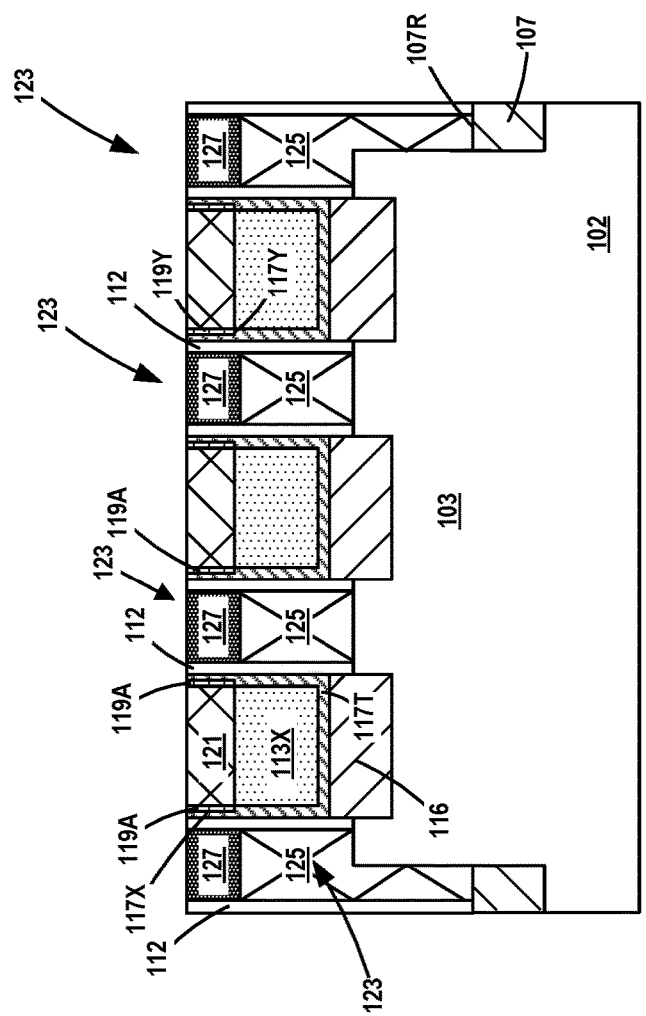

FIG. 7 depicts the product 100 after several process operations were performed to form final (and simplistically depicted) replacement gate structures 125 for the transistor devices by performing traditional replacement gate manufacturing techniques. First, a plurality of etching processes was performed to sequentially remove the gate caps 111 and the sacrificial gates structures 108 (including the material for the sacrificial gate electrodes and the material for the sacrificial gate insulation layers). This process operation defines a plurality of replacement gate cavities 123 in the space that is at least partially bounded (in the horizontal direction) by the low-k spacers 112. Next, various process operations were performed to form illustrative and simplistically depicted replacement gate structures 125 in each of the gate cavities 123. In general, the replacement gate structures 125 may be comprised of one or more layers of insulating material that serve (in whole or part) as the gate insulation layer (not separately depicted) of the final gate structure 125 for the transistor devices, and one or more layers of conductive material (not separately depicted), e.g., a metal, a metal alloy, polysilicon, a work-function adjusting metal, etc., that function (in whole or part) as the conductive gate electrode of the final gate structure 125 of the transistor devices. The materials of construction for the gate structures 125 may be different for N- and P-type devices. The thickness and composition of the materials for the replacement gate structure 125 may vary depending upon the particular application. In one illustrative embodiment, the gate insulating material may be made of a high-k (k value of 10 or greater) insulating material, such as hafnium oxide, while the conductive gate electrode may be comprised of a metal or a metal-containing material such as titanium nitride (not separately shown) that functions as a work-function adjusting layer, and a bulk layer of conductive material such as a metal, a metal alloy, tungsten or a doped polysilicon. As will be appreciated by those skilled in the art after a complete reading of the present application, the replacement gate structure 125 depicted herein is intended to be representative of any type of gate structure that may be formed using replacement gate manufacturing techniques.

In one illustrative process flow, after formation of the materials for the replacement gate structure 125 in the gate cavities 123, one or more recess etching processes may be performed to remove portions of, or recess, the materials of the replacement gate structure 125 within the gate cavities 123 to make room for a final gate cap 127. The final gate cap 127 (e.g., silicon nitride) may be formed by depositing a layer of the gate cap material so as to overfill the gate cavities 123 in the space above the recessed gate materials. At that point, one or more CMP processes may be performed to remove excess materials positioned outside of the gate cavities 123 and above the layer of insulating material 121. Typically, during these CMP process operations, a portion of the vertical height of the various structures is consumed. For example, as shown in FIG. 7, the upper portion 119X of the high-k spacer 119A was removed during these process operations thereby leaving the lower portion 119Y of the high-k spacer 119A positioned laterally adjacent the exposed and trimmed vertical portions 117X of the CESLs 117 and above the recessed surface 117Y of the trimmed CESL 117T, i.e., the high-k spacer is positioned in the recesses 117Z.

Figure 8:
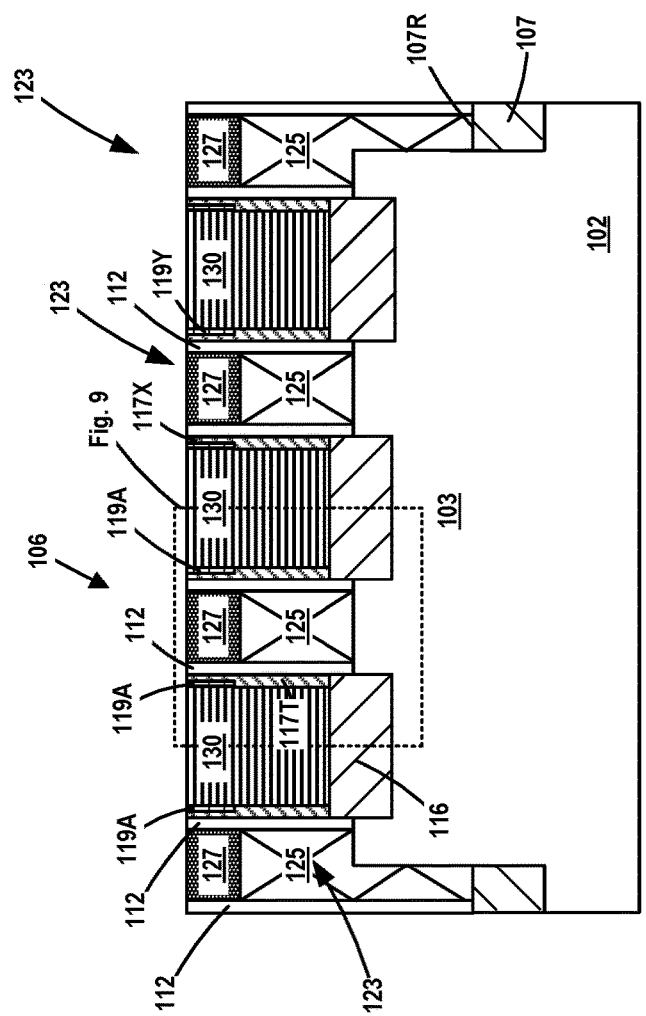
Figure 9:
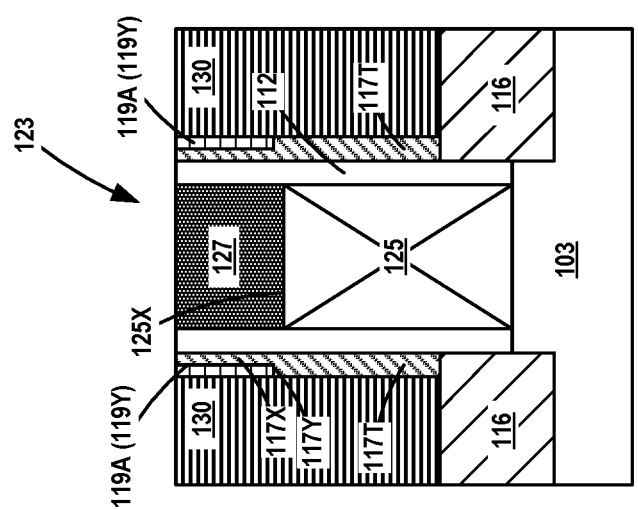

FIGS. 8 and 9 depict the product 100 after several process operations were performed. FIG. 9 is an enlarged view of a portion of the product 100 shown in FIG. 8. Initially, one or more etching processes were performed to remove the insulating materials 121 and 113 selectively relative to the surrounding materials, e.g., the trimmed CESLs 117T, the high-k spacer 119A and the low-k spacer 112. Removal of the insulating materials 121 and 113 exposes the trimmed CESLs 117T. At that point, an anisotropic etching process is performed to remove the horizontally oriented portions of the trimmed CESLs 117T relative to the surrounding materials. This etching process exposes the upper surface of the epi semiconductor material 116. Then, material(s) for illustrative conductive source/drain structures 130 (e.g., trench silicide structures) was formed above the product 100 so as to over-fill the spaces above the exposed epi semiconductor material 116 in the source/drain regions of the devices. At that point, one or more CMP process operations were performed to planarize the upper surface of the product 100 with the upper surface of the gate caps 127. In one illustrative embodiment, the conductive source/drain structures 130 (sometimes referred to as source/drain metallization structures) may extend at least for substantially the entire dimension of the active region in the gate width direction of the transistor devices (into and out of the plane of the drawing page in FIGS. 8 and 9) and in some cases may extend across the source/drain regions of multiple transistor devices.

With reference to FIG. 9, note that, in one illustrative embodiment, the upper surface 125X of the final gate structure 125 may be positioned slightly below the post-trimming upper surface 117Y of the trimmed CESLs 117T. Also note that, in the depicted example, the low-k spacer 112 is positioned on and in contact with the final gate structure 125 and the gate cap 127, while the remaining portions of the trimmed CESLs 117T including the trimmed substantially vertically oriented portions 117X of the CESLs 117 are positioned on and in contact with the low-k spacer 112.

Finally, it should be noted that, in one embodiment, the high-k spacer 119A is positioned on and in contact with the trimmed upper surface 117Y and the exposed vertical portion 117X of the trimmed CESL 117T, i.e., the high-k spacer is formed in the recesses 117Z in the trimmed CESLs 117T. Of course, as noted above, in some embodiments, additional materials may be present between these materials and structures, e.g., one or more materials may be present between the low-k spacer 112 and the trimmed CESLs 117T. Similarly, there may be some applications where one or more materials are positioned between the high-k spacer 119A and the trimmed CESLs 117T. Lastly, there may be some applications where one or more materials are present between the low-k spacer 112 and the final gate structure 125 and/or the gate cap 127.

As will be appreciated by those skilled in the art after a complete reading of the present application, there are many novel methods and devices disclosed herein. In one embodiment, when looking at it from the perspective of a single gate structure 108, one novel method may comprise forming a low-k sidewall spacer 112 adjacent opposing sidewalls of the gate structure 108, forming first and second conformal contact etch stop layers (CESLs) 117 above each of first and second source/drain regions of the transistor, respectively, wherein the first and second CESLs 117 are positioned adjacent the low-k sidewall spacer 112, and forming the first insulating material 113 above the first and second CESLs 117. In this example, the method also includes recessing the first insulating material 113 so as to form recessed first insulating material 113X that exposes vertically oriented portions of the first and second CESLs 117 and removing a portion of a lateral width or thickness of the exposed vertically oriented portions of the first and second CESLs 117 so as to form first and second trimmed CESLs 117T, each of which comprise trimmed substantially vertically oriented portions 117X. In this example, the method also includes forming a high-k spacer 119A on opposite sides of the gate structure 108, wherein the high-k spacer 119A is positioned laterally adjacent the substantially vertically oriented and trimmed portions 117X of the first and second trimmed CESLs 117T, and forming a second insulating material 121 above the recessed first insulating material 113X located in the first and second source/drain regions and adjacent the high-k sidewall spacer 119A.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:
1. An integrated circuit product, comprising:
   a final gate structure for a transistor device;

a gate cap positioned above said final gate structure, said final gate structure comprising first and second opposing sidewalls;
first and second source/drain regions formed in a semiconductor substrate, wherein said first and second source/drain regions are, respectively, positioned adjacent said first and second opposing sidewalls, respectively, of said final gate structure;
a low-k sidewall spacer positioned on and in contact with said first and second opposing sidewalls of said final gate structure;
a first and a second contact etch stop layer (CESL) wherein said first and second CESLs are, respectively, positioned adjacent said first and second opposing sidewalls, respectively, of said final gate structure, said first and second CESLs being positioned on and in contact with said low-k sidewall spacer, each of said first and second CESLs having a recess formed in an upper portion thereof; and
a high-k spacer located on opposite sides of said final gate structure, wherein said high-k spacer is positioned in said recess formed in said first and second CESLs.

2. The integrated circuit product of claim 1, further comprising first and second regions of epi semiconductor material in said first and second source/drain regions, respectively, wherein said first and second CESLs, respectively, contact an upper surface of said first and second regions of epi semiconductor material, respectively.

3. The integrated circuit product of claim 1, wherein said final gate structure comprises a gate electrode comprising a metal layer and a high-k gate insulation layer and wherein said transistor device is a FinFET device.

4. The integrated circuit product of claim 1, wherein said low-k spacer comprises a material having a k value of 5.2 or less, said high-k spacer comprises a material having a k value of 10 or greater and said first and second CESLs comprise silicon nitride.

5. The integrated circuit product of claim 1, wherein said high-k spacer is positioned on and in contact with said first and second CESLs-.

6. The integrated circuit product of claim 1, wherein said recess in each of said first and second CESLs is at least partially defined by a substantially horizontally oriented surface and a substantially vertically oriented surface and wherein said high-k spacer is positioned on and in contact with said substantially horizontally oriented surface and said substantially vertically oriented surface of said recess in each of said first and second CESLs.

7. The integrated circuit product of claim 1, wherein each of said first and second CESLs further comprise a lower portion that is positioned below said upper portion of said first and second CESLs, wherein an outer surface of said lower portion of said first and second CESLs is not contacted by said high-k spacer.

8. An integrated circuit product, comprising:
a final gate structure for a transistor device;
a gate cap positioned above said final gate structure, said final gate structure comprising first and second opposing sidewalls;
first and second source/drain regions formed in a semiconductor substrate, wherein said first and second source/drain regions are respectively, positioned adjacent said first and second opposing sidewalls, respectively, of said final gate structure;
a low-k sidewall spacer positioned on and in contact with said first and second opposing sidewalls of said final gate structure;
a first and a second contact etch stop layer (CESL) wherein said first and second CESLs, are, respectively, positioned adjacent said first and second opposing sidewalls, respectively, said first and second CESLs being positioned on and in contact with said low-k sidewall spacer, wherein each of said first and second CESLs comprises a first substantially horizontally oriented upper surface and wherein an upper portion of each of said first and second CESLs comprises a second substantially horizontally oriented surface and a substantially vertically oriented surface; and
a high-k spacer positioned on and in contact with said second substantially horizontally oriented surface and said substantially vertically oriented surface of said first and second CESLs.

9. The integrated circuit product of claim 8, further comprising first and second regions of epi semiconductor material in said first and second source/drain regions, respectively, wherein a lower portion of said first and second CESLs, respectively, contact an upper surface of said first and second regions of epi semiconductor material, respectively.

10. The integrated circuit product of claim 9, wherein said final gate structure comprises a gate electrode comprising a metal layer and a high-k gate insulation layer and wherein said transistor device is a FinFET device.

11. The integrated circuit product of claim 8, wherein said low-k spacer comprises a material having a k value of 5.2 or less, said high-k spacer comprises a material having a k value of 10 or greater and said first and second CESLs comprise silicon nitride.

12. The integrated circuit product of claim 8, wherein each of said first and second CESLs further comprise a lower portion that is positioned below said upper portion of said first and second CESLs, wherein an outer surface of said lower portion of said first and second CESLs is not contacted by said high-k spacer.

13. The integrated circuit product of claim 8, wherein said first substantially horizontally oriented upper surface of said first and second CESLs is not contacted by said high-k spacer.

14. An integrated circuit product, comprising:
a final gate structure for a transistor device;
a gate cap positioned above said final gate structure, said final gate structure comprising first and second opposing sidewalls;
first and second source/drain regions formed in a semiconductor substrate, wherein said first and second source/drain regions are, respectively, positioned adjacent said first and second opposing sidewalls, respectively, of said final gate structure;
a low-k sidewall spacer positioned on and in contact with said first and second opposing sidewalls of said final gate structure;
a first and a second contact etch stop layer (CESL) wherein said first and second CESLs are, respectively, positioned adjacent said first and second opposing sidewalls, respectively, of said final gate structure, said first and second CESLs being positioned on and in contact with said low-k sidewall spacer, wherein each of said first and second CESLs comprises a first substantially horizontally oriented upper surface, an upper portion and a lower portion positioned below said upper portion, wherein said upper portion of each of said first and second CESLs comprises a second substantially horizontally oriented surface and a substantially vertically oriented surface; and a high-k spacer positioned on and in contact with said second substantially horizontally oriented surface and said substantially vertically oriented surface of said first and second CESLs and wherein said first substantially horizontally oriented upper surface of said first and second CESLs is not contacted by said high-k spacer and wherein an outer surface of said lower portion of said first and second CESLs is not contacted by said high k spacer.

15. The integrated circuit product of claim 14, further comprising first and second regions of epi semiconductor material in said first and second source/drain regions, respectively, wherein said lower portion of said first and second CESLs, respectively, contact an upper surface of said first and second regions of epi semiconductor material, respectively.

16. The integrated circuit product of claim 15, wherein said final gate structure comprises a gate electrode comprising a metal layer and a high-k gate insulation layer and wherein said transistor device is a FinFET device.

17. The integrated circuit product of claim 14, wherein said low-k spacer comprises a material having a k value of 5.2 or less, said high-k spacer comprises a material having a k value of 10 or greater and said first and second CESLs comprise silicon nitride.

\* \* \* \* \*